(12) United States Patent  (10) Patent No.: US 9,041,130 B2
Kobayashi et al.  (45) Date of Patent: May 26, 2015

(54) MAGNETIC MEMORY DEVICE

(71) Applicant: KABUSHIKI KAISHA TOSHIBA, Minato-ku, Tokyo (JP)

(72) Inventors: Shinya Kobayashi, Yokohama (JP); Kenji Noma, Yokohama (JP); Hisato Oyamatsu, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/177,963

(22) Filed: Feb. 11, 2014

(65) Prior Publication Data

US 2015/0069546 A1  Mar. 12, 2015

Related U.S. Application Data

(60) Provisional application No. 61/875,546, filed on Sep. 9, 2013.

(51) Int. Cl.
H01L 29/82 (2006.01)
H01L 43/02 (2006.01)
H01L 27/22 (2006.01)

(52) U.S. Cl.
CPC .............. *H01L 43/02* (2013.01); *H01L 27/222* (2013.01)

(58) Field of Classification Search
USPC .................. 257/421, 422, 424, 425, 432, 433
See application file for complete search history.

(56) References Cited

U.S. PATENT DOCUMENTS 6,713,830 B2  3/2004  Nishimura et al.

FOREIGN PATENT DOCUMENTS

| JP | 2008-306094 A | 12/2008 |
| JP | 2011-114211 A | 6/2011 |
| JP | 2013-016645 A | 1/2013 |
| JP | 2013-088866 A | 5/2013 |

OTHER PUBLICATIONS

U.S. Appl. No. 14/020,562, Title: "Magnetic Memory Device", First Named Inventor: Kenji Noma, filed Sep. 6, 2013.

*Primary Examiner* — Tan N Tran
(74) *Attorney, Agent, or Firm* — Holtz, Holtz, Goodman & Chick PC

(57) ABSTRACT

According to one embodiment, a magnetic memory device includes a semiconductor substrate, a memory cell array area on the semiconductor substrate, the memory cell array area including magnetoresistive elements, each of the magnetoresistive elements having a reference layer with an invariable magnetization, a storage layer with a variable magnetization, and a tunnel barrier layer therebetween, a magnetic field generating area which generates a first magnetic field cancelling a second magnetic field applying from the reference layer to the storage layer, and which is separated from the magnetoresistive elements, and a closed magnetic path area functioning as a closed magnetic path of the first magnetic field, and surrounding the memory cell array area and the magnetic field generating area.

20 Claims, 18 Drawing Sheets

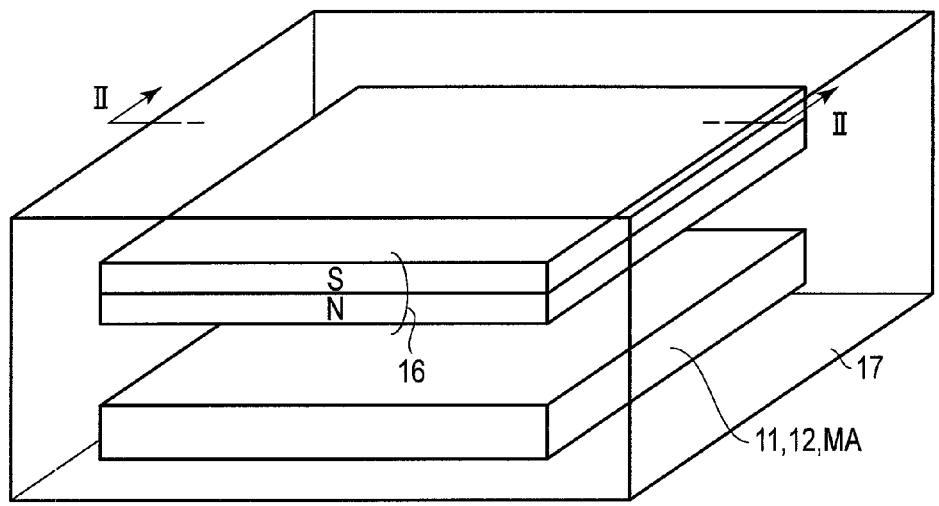
F I G. 1
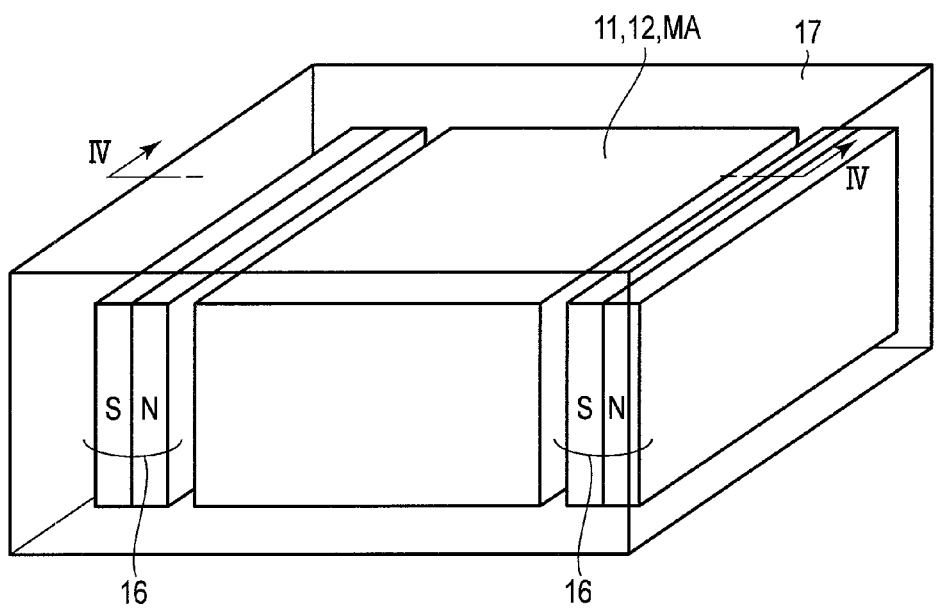
F I G. 3

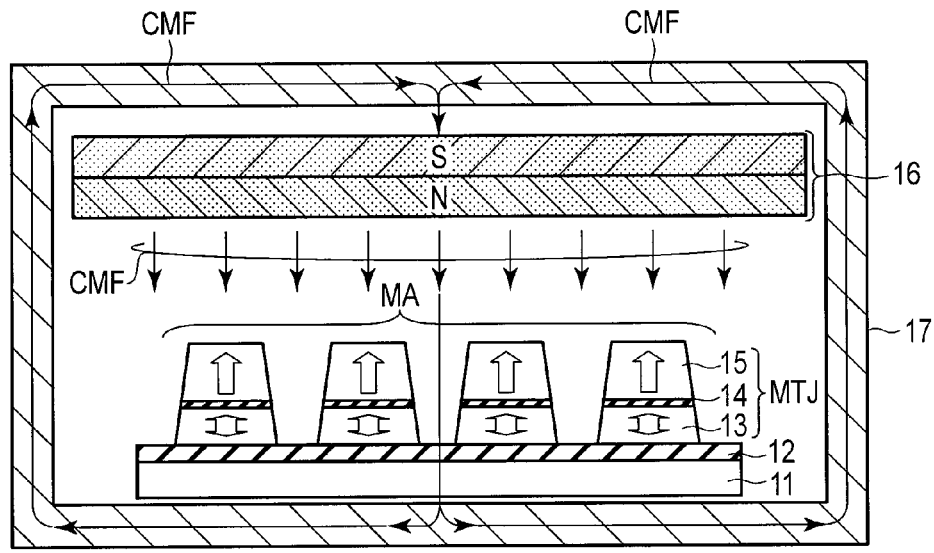
F I G. 2
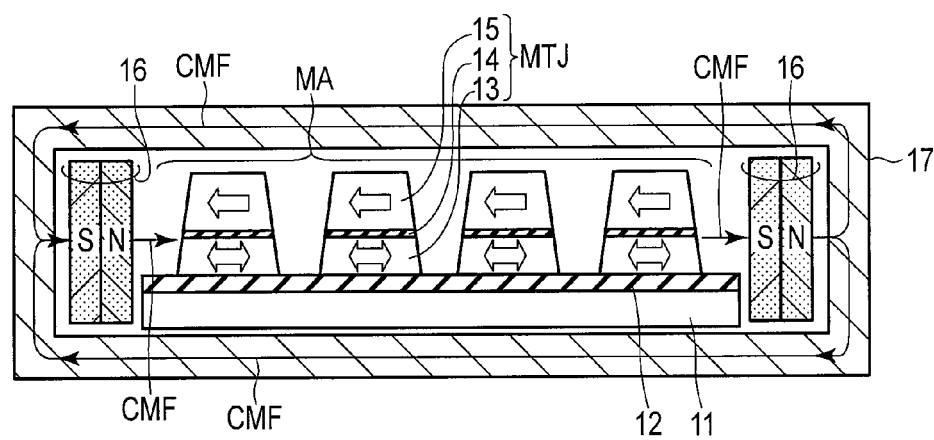
F I G. 4

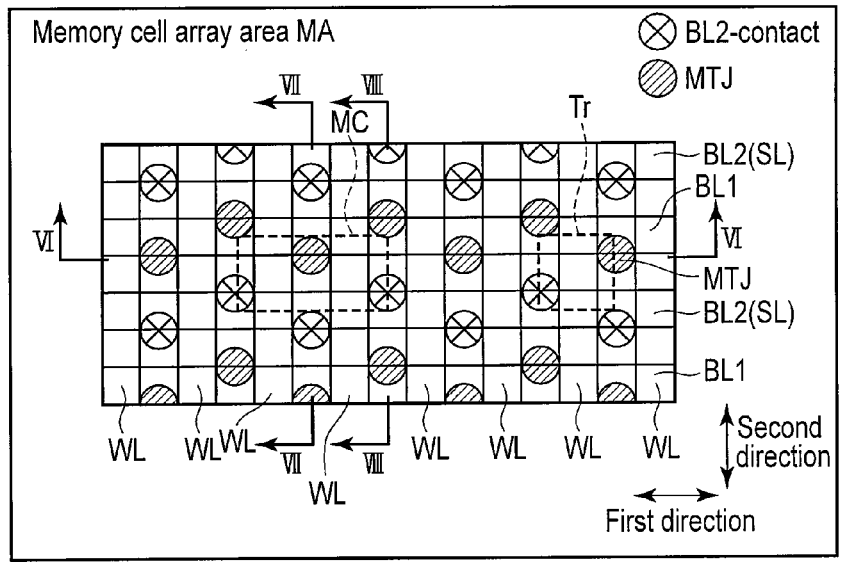
F I G. 5
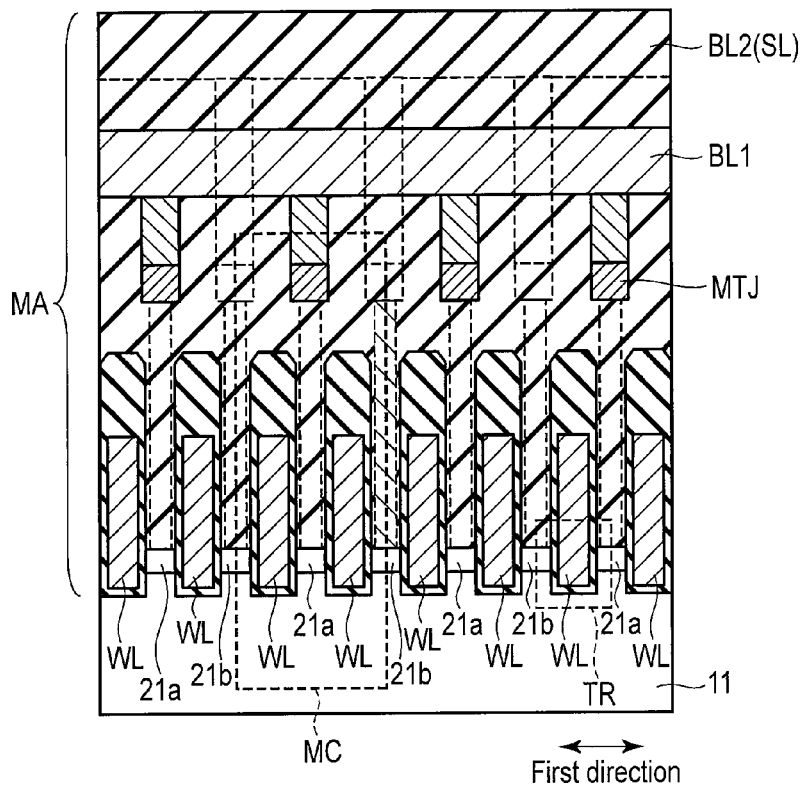
F I G. 6

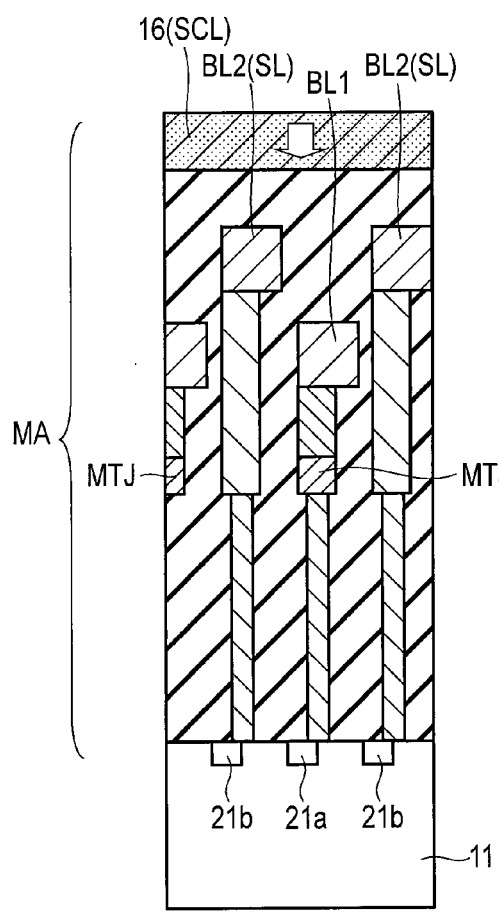 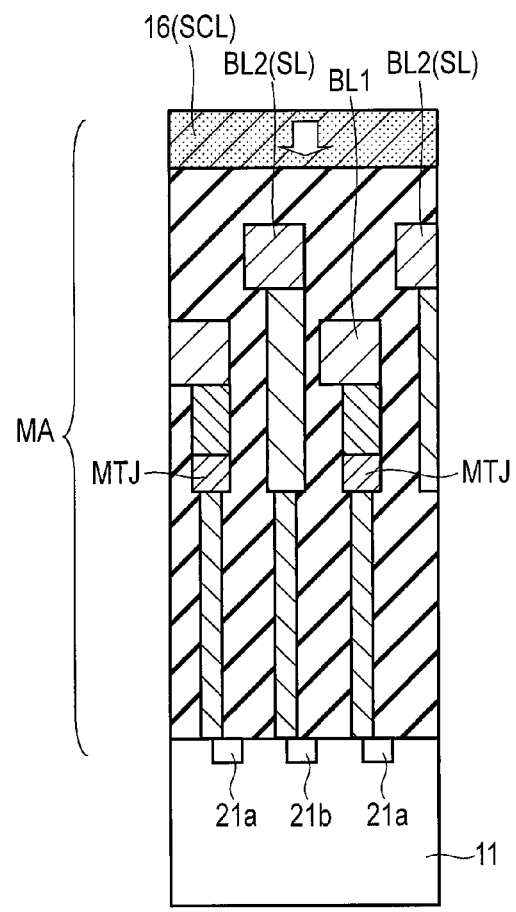
F I G. 15     F I G. 16

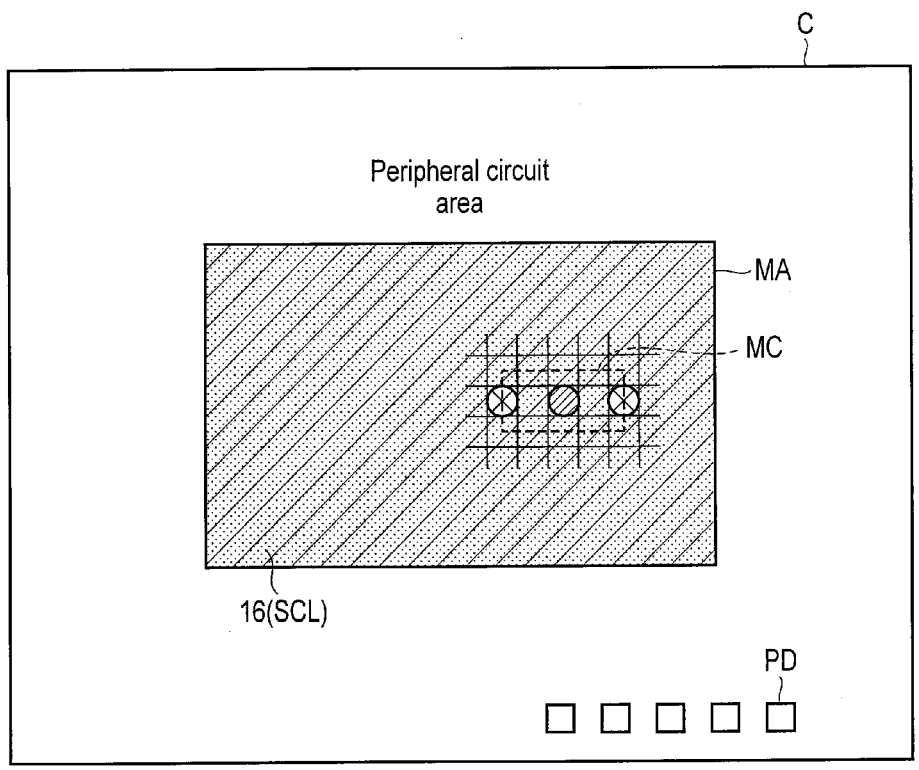
F I G. 17

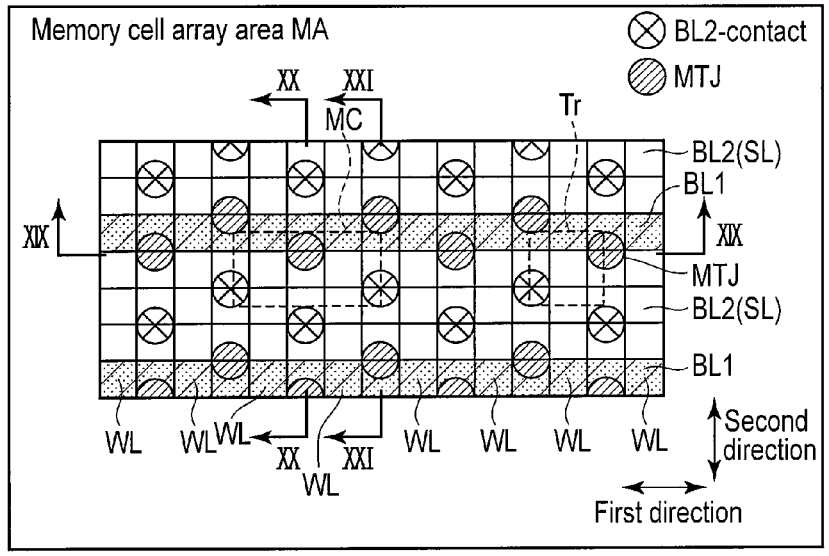
F I G. 18
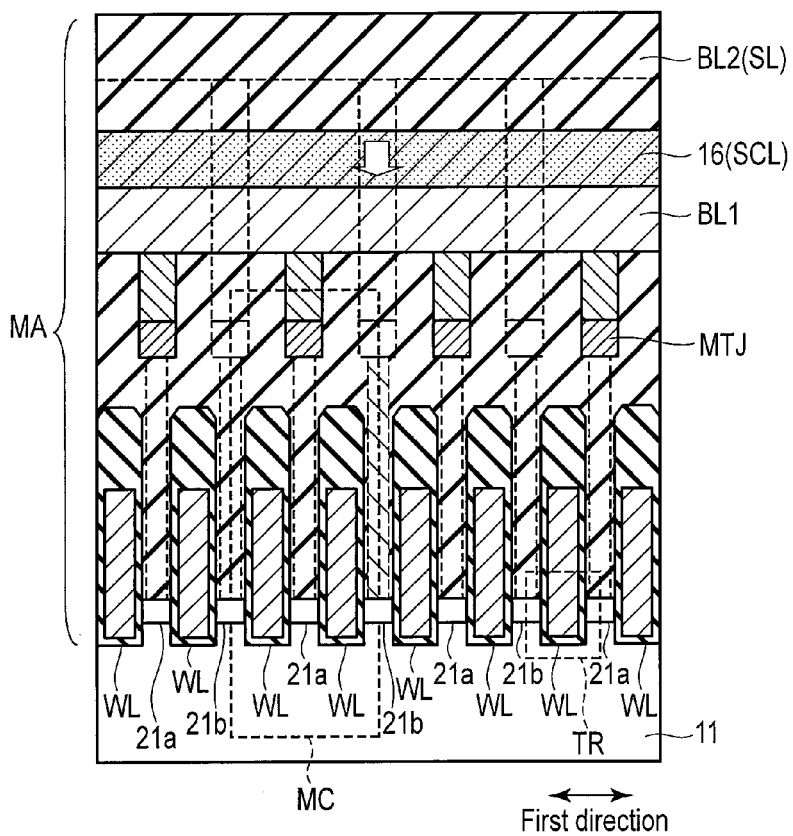
F I G. 19

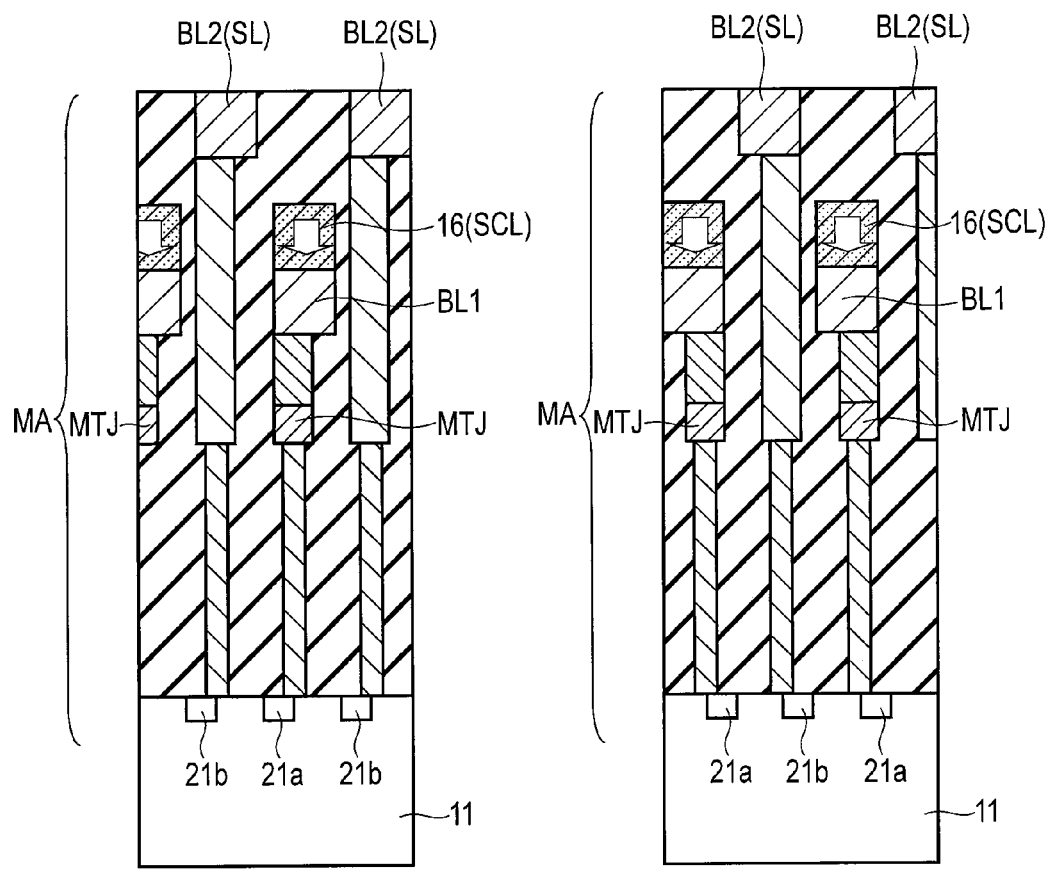
F I G. 20   F I G. 21

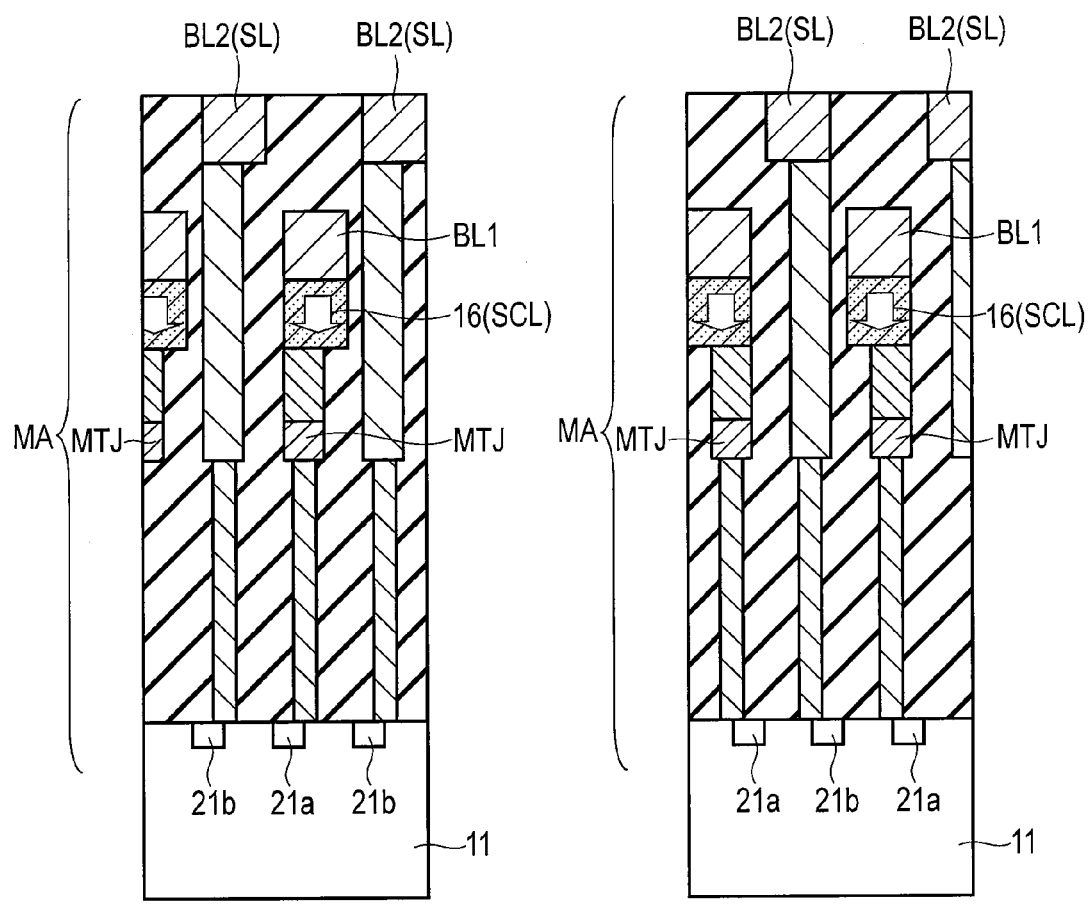
F I G. 24    F I G. 25

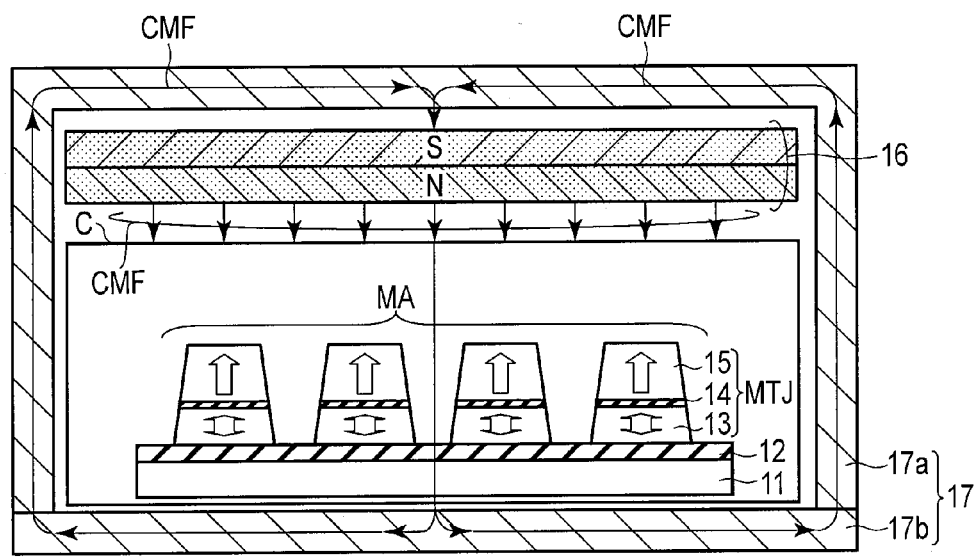
F I G. 26

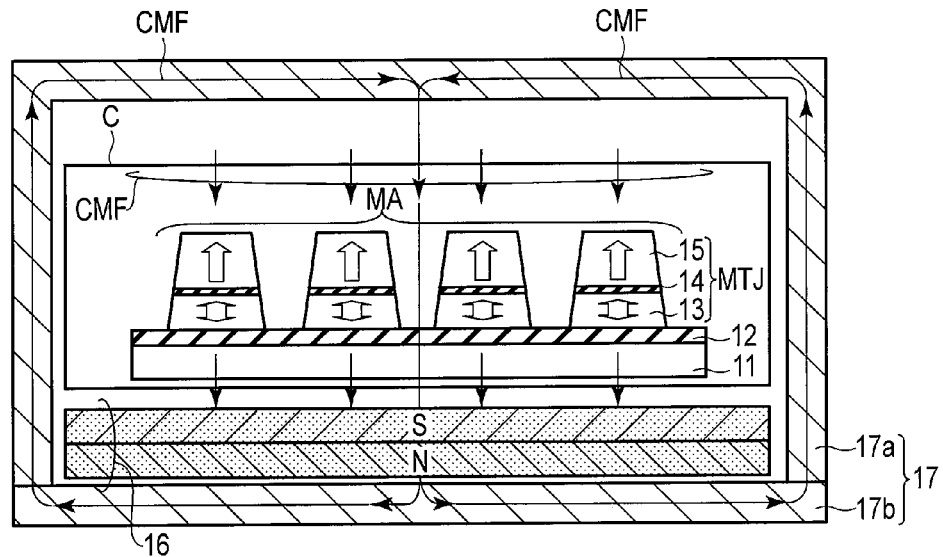
F I G. 27
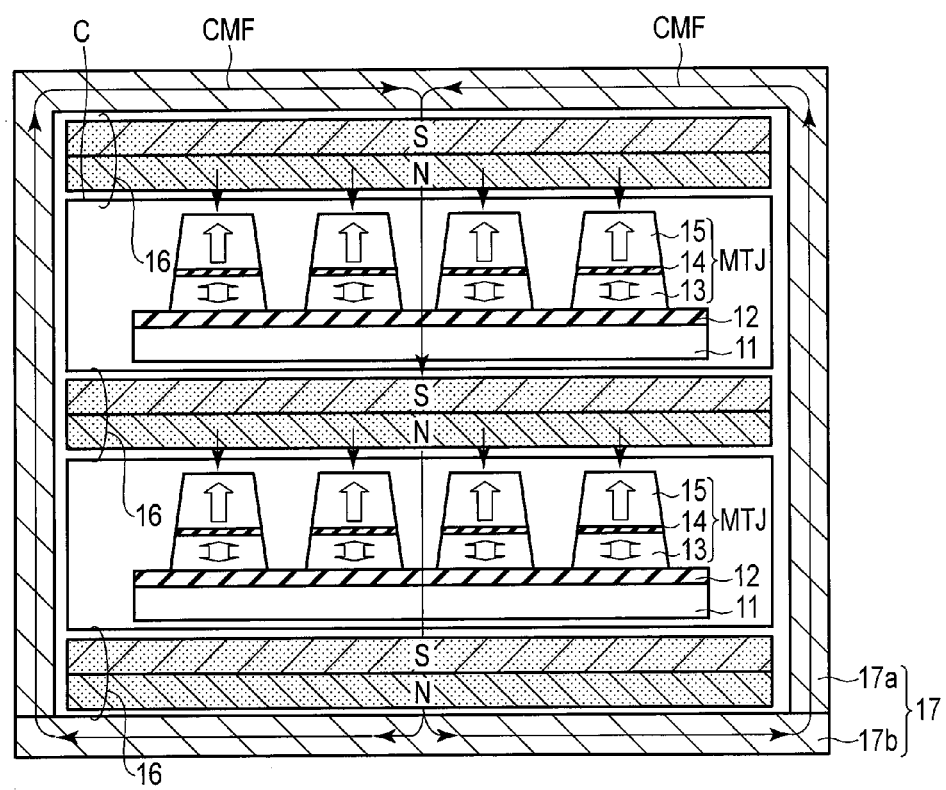
F I G. 28

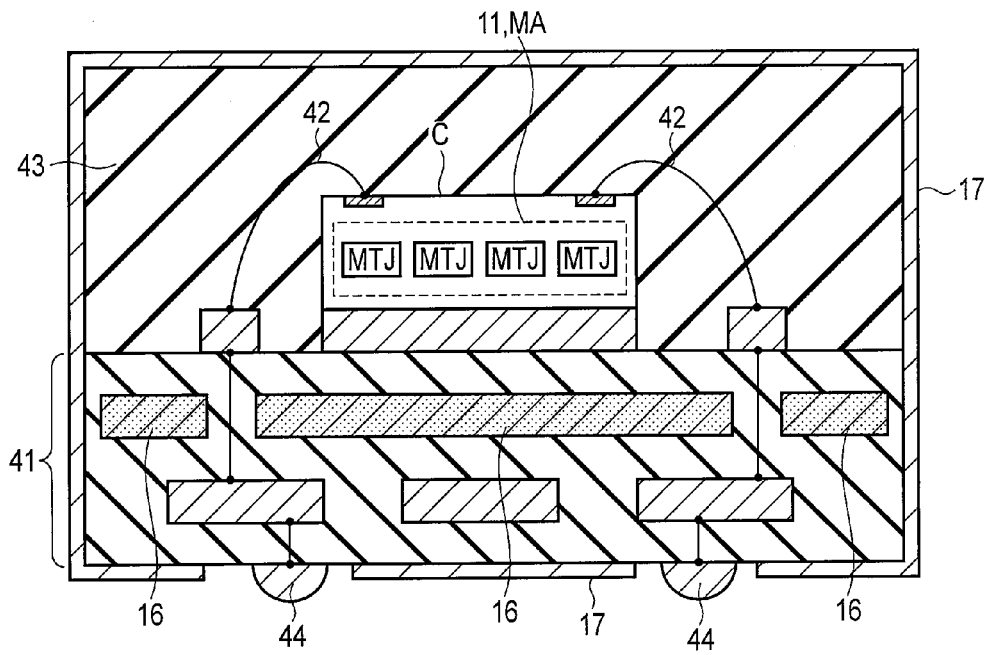
F I G. 29
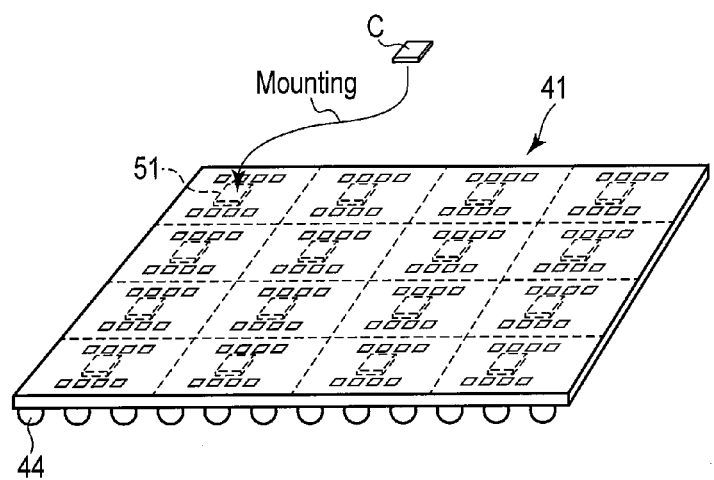
F I G. 30

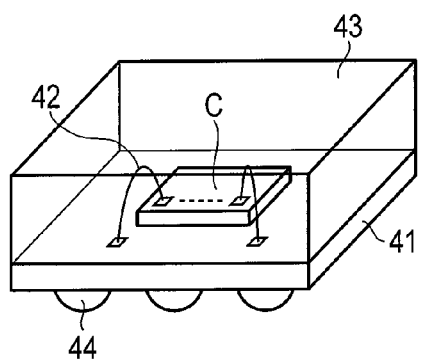
F I G. 3 1
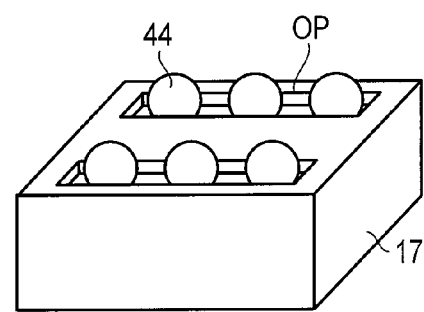
F I G. 3 2
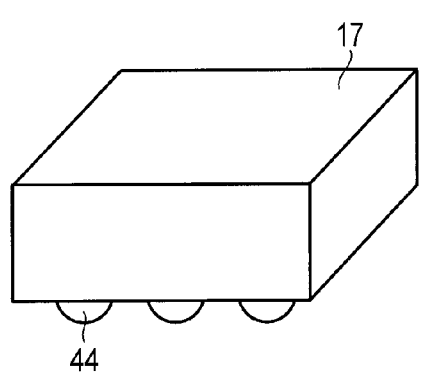
F I G. 3 3
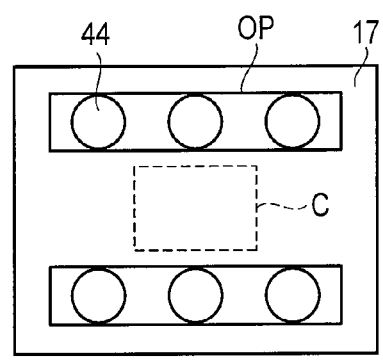
F I G. 3 4

MAGNETIC MEMORY DEVICE

CROSS-REFERENCE TO RELATED APPLICATIONS

This application claims the benefit of U.S. Provisional Application No. 61/875,546, filed Sep. 9, 2013, the entire contents of which are incorporated herein by reference.

FIELD

Embodiments described herein relate generally to a magnetic memory device.

BACKGROUND

A magnetoresistive element comprises a reference layer having invariable magnetization, a storage layer having variable magnetization, and a tunnel barrier layer interposed between the reference layer and the storage layer. To the magnetoresistive element, data is written by, for example, supplying current to the magnetoresistive element, and reversing the magnetization of the storage layer.

Magnetization reverse current which reverses the magnetization of the storage layer shifts due to a stray magnetic field from the reference layer. In order to cancel this shifting of the magnetization reverse current, as well known, a shift cancelling layer having invariable magnetization in a direction opposite to the magnetization direction of the reference layer is added to the magnetoresistive element.

BRIEF DESCRIPTION OF THE DRAWINGS

FIG. 1 is a perspective view of a magnetic memory device according to a first embodiment;

FIG. 2 is a cross-sectional view taken along line II-II in FIG. 1;

FIG. 3 is a perspective view of the magnetic memory device according to the first embodiment;

FIG. 4 is a cross-sectional view taken along line IV-IV in FIG. 3;

FIG. 5 is a plan view showing an example of a memory cell array area;

FIG. 6 is a cross-sectional view taken along line VI-VI in FIG. 5;

FIG. 15 is a cross-sectional view taken along line XV-XV in FIG. 13;

FIG. 16 is a cross-sectional view taken along line XVI-XVI in FIG. 13;

FIG. 17 is a plan view for showing an example of a layout of a magnetic-field generation area;

FIG. 18 is a plan view for showing a second example of the memory cell array as shown in FIG. 12;

FIG. 19 is a cross-sectional view taken along line XIX-XIX in FIG. 18;

FIG. 20 is a cross-sectional view taken along line XX-XX in FIG. 18;

FIG. 21 is a cross-sectional view taken along line XXI-XXI in FIG. 18;

FIG. 24 is a cross-sectional view taken along line XXIV-XXIV in FIG. 22;

FIG. 25 is a cross-sectional view taken along line XXV-XXV in FIG. 22;

FIGS. 26-28 are cross-sectional views of a magnetic memory device according to a third embodiment;

FIG. 29 is a cross-sectional view of a magnetic memory device according to a fourth embodiment; and FIGS. 30-34 are views for showing a manufacturing method of the magnetic memory device as shown in FIG. 29.

DETAILED DESCRIPTION

Figures 7, 8:
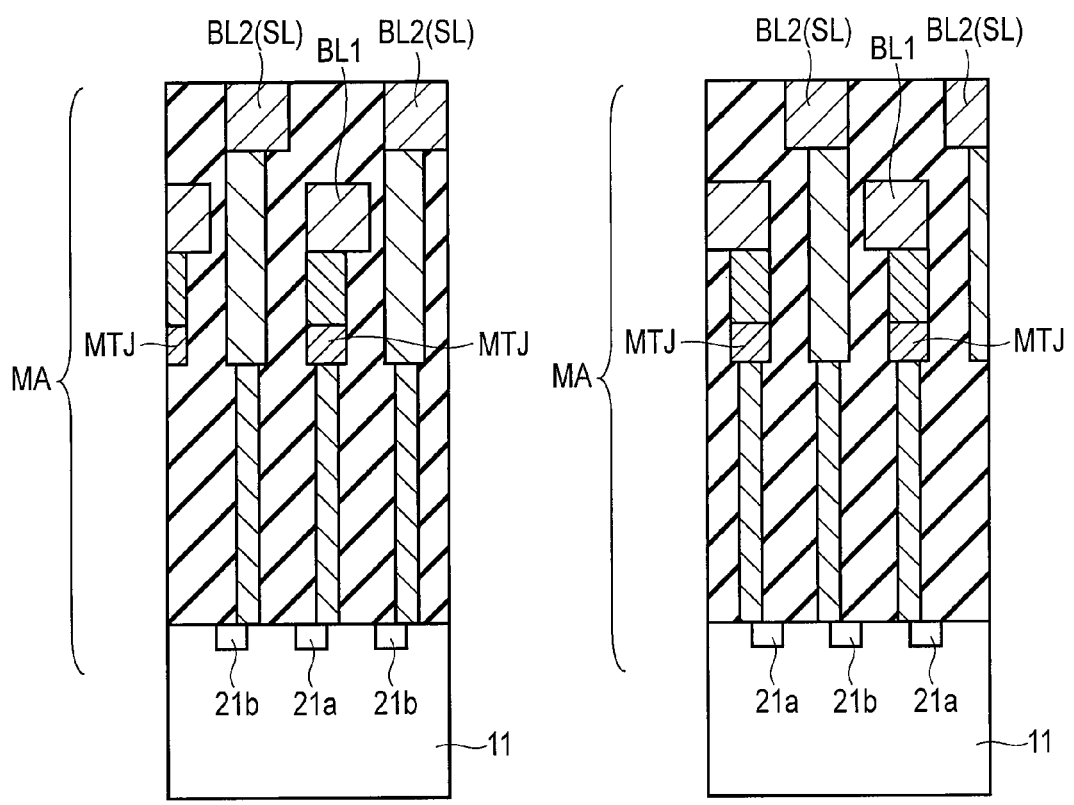
FIG. 7 is a cross-sectional view taken along line VII-VII in FIG. 5.
FIG. 8 is a cross-sectional view taken along line VIII-VIII in FIG. 5.

In general, according to one embodiment, a magnetic memory device comprises: a semiconductor substrate; a memory cell array area on the semiconductor substrate, the memory cell array area including magnetoresistive elements, each of the magnetoresistive elements having a reference layer with an invariable magnetization, a storage layer with a variable magnetization, and a tunnel barrier layer therebetween; a magnetic field generating area which generates a first magnetic field cancelling a second magnetic field applying from the reference layer to the storage layer, and which is separated from the magnetoresistive elements; and a closed magnetic path area functioning as a closed magnetic path of the first magnetic field, and surrounding the memory cell array area and the magnetic field generating area.

Embodiments will be hereinafter described with reference to the accompanying drawings.

First Embodiment

A first embodiment will be explained with reference to FIGS. 1-4. FIG. 2 is a cross-sectional view taken along line II-LL in FIG. 1. FIG. 4 is a cross-sectional view taken along line IV-IV in FIG. 3.

A magnetic memory device according to the first embodiment comprises semiconductor substrate 11, insulating layer 12 provided on semiconductor layer 11, memory cell array area MA provided on insulating layer 12, magnetic field generating area 16, and closed magnetic path area 17.

Memory cell array area MA includes magnetoresistive elements MTJ arranged in an array. Each of magnetoresistive elements MTJ comprises storage layer (magnetic layer) 13 having variable magnetization, reference layer (magnetic layer) 15 having invariable magnetization and tunnel barrier layer (insulating layer) 14 interposed between storage layer 13 and reference layer 15.

With respect to the first embodiment, it will be explained by way of example that reference layer 15 is located on storage layer 13. However, storage layer 13 may be located on reference layer 15.

In an example shown in FIGS. 1 and 2, storage layer 13 and reference layer 15 have perpendicular magnetization perpendicular to a surface of semiconductor layer 11. That is, magnetoresistive elements MTJ as shown in FIGS. 1 and 2 are of perpendicular magnetization type. On the other hand, in an example shown in FIGS. 3 and 4, storage layer 13 and reference layer 15 have in-plane magnetization parallel to the surface of semiconductor layer 11. That is, magnetoresistive elements MTJ as shown in FIGS. 3 and 4 are of in-plane magnetization type.

Magnetic field generating area 16 generates cancel magnetic field CMF which cancels a stray magnetic field applied from reference layer 15 to storage layer 13. The magnetic field generating area includes a permanent magnet, a magnetic layer having invariable magnetization, etc.

Magnetic field generating area 16 is separated from magnetoresistive elements MTJ, and disposed in a predetermined position to cancel the stray magnetic field.

For example, as shown in FIG. 2, if magnetoresistive elements MTJ are of perpendicular magnetization type, it is preferable that magnetic field generating area 16 be located above (or below) memory cell array area MA. For example, magnetic field generating area 16 is provided in a direction in that storage layer 13, tunnel barrier layer 14 and reference layer 15 are stacked. In this case, cancel magnetic field CMF has magnetic lines of force perpendicular to the surface of the semiconductor layer 11 in memory cell array area MA. In other words, cancel magnetic field CMF has magnetic lines of force extending in a direction in that storage layer 13, tunnel barrier layer 14 and reference layer 15 are stacked.

Furthermore, as shown in FIG. 4, if magnetoresistive elements MTJ are of in-plane magnetization type, it is preferable that magnetic field generating areas 16 be located on left and right sides of memory cell array area MA. For example, magnetic field generating area 16 is provided in a direction perpendicular to a direction in that storage layer 13, tunnel barrier layer 14 and reference layer 15 are stacked. In this case, cancel magnetic field CMF has magnetic lines of force parallel to the surface of the semiconductor layer 11 in memory cell array area MA. In other words, cancel magnetic field CMF has magnetic lines of force extending in a direction perpendicular to a direction in that storage layer 13, tunnel barrier layer 14 and reference layer 15 are stacked.

Closed magnetic path area 17 functions as a closed magnetic path of cancel magnetic field CMF generated from magnetic field generating area 16, and surrounds memory cell array area MA and magnetic field generating area 16. Closed magnetic path area 17 includes a magnetic material. Also, closed magnetic path area 17 functions as a package for memory cell array area MA and magnetic field generating area 16.

It is preferable that magnetic field generating area 16 include a Co—Cr alloy, an Sm—Co alloy, a Co—Pt alloy, an Fe—Pt alloy, Nd—Fe alloy, an Mn—Al alloy, an Al—Ni—Co alloy, a Ba ferrite oxide, a Co ferrite oxide, etc.

Since magnetic field generating area 16 is separated from magnetoresistive elements MTJ, it is preferable that the intensity of cancel magnetic field CMF generated from magnetic field generating area 16 be equal to or higher than 10,000e.

Also, it is preferable that closed magnetic path area 17 include Ni, Fe, Co, an Ni—Fe alloy, an Fe—Co alloy, Fe2O4 containing Ni, Mn or Zn, etc., and also that closed magnetic path area 17 have a thickness which falls within the range of 100 nm to 100 μm in order to ensure a magnetic shield effect and function as a package.

Figure 9:
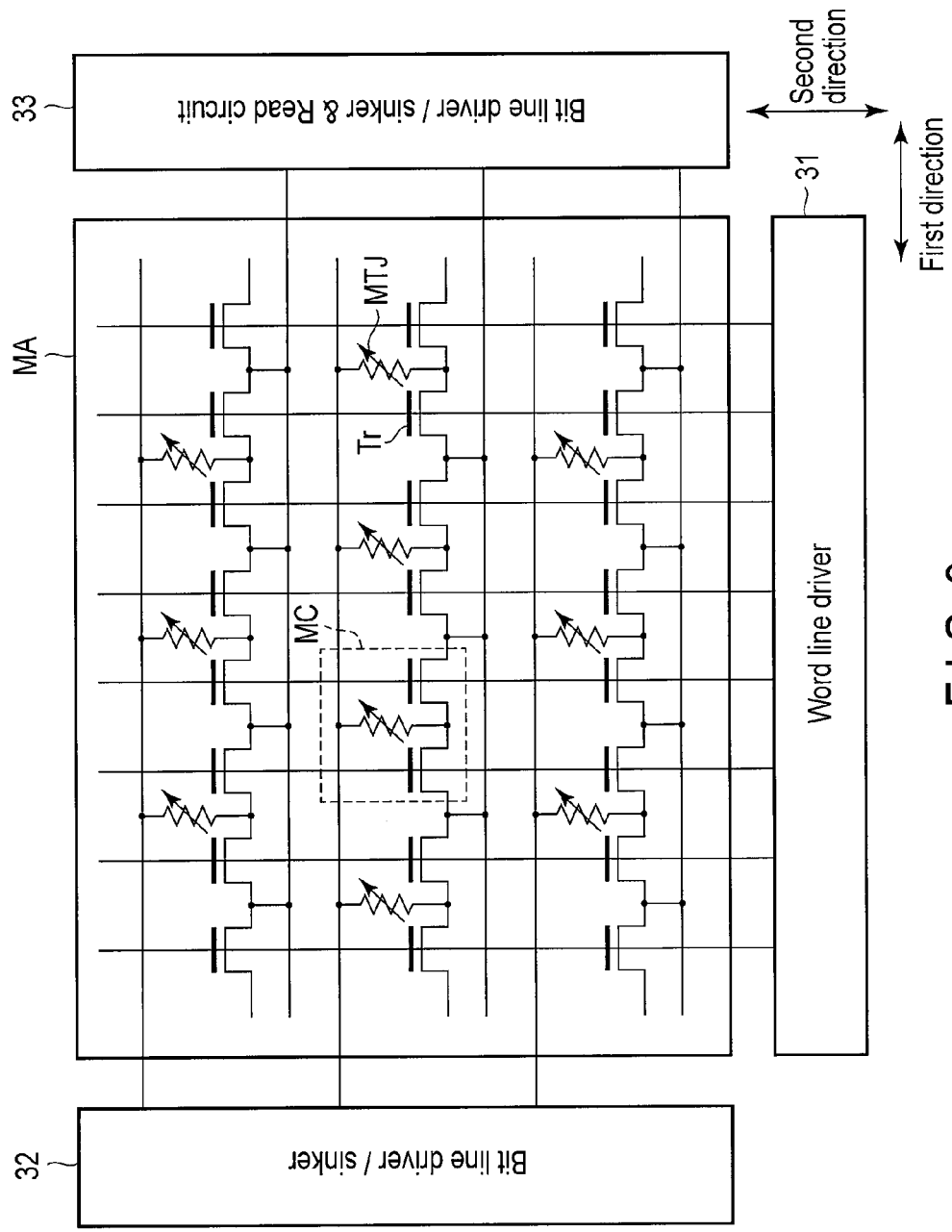
FIG. 9 is a view for showing an equivalent circuit in the memory cell array area as shown in FIG. 5.

FIGS. 5-8 show an example of the memory cell array area. FIG. 6 is a cross-sectional view taken along line VI-VI in FIG. 5. FIG. 7 is a cross-sectional view taken along line VII-VII in FIG. 5. FIG. 8 is a cross sectional view taken along line VIII-VIII in FIG. 5. FIG. 9 shows an equivalent circuit in the memory cell area as shown in FIG. 5.

With respect to the first embodiment, an explanation will be given on the assumption that each of memory cells MC in memory cell array area MA comprises two selection transistors Tr and single magnetoresistive element MTJ; that is, each memory cell MC is a so-called 2Tr-1MTJ type memory cell. This, however, does not mean that the first embodiment is applied only to memory cell array area MA comprising 2Tr-1MTJ type memory cells. That is, the first embodiment can be applied to memory cell array area MA comprising memory cells other than the 2Tr-1MTJ type memory cells, such as 1Tr-1MTJ type memory cells or cross-point type memory cells.

On semiconductor layer 11, memory cells MC are arranged in an array. Each of memory cells MC comprises two selection transistors Tr on semiconductor layer 11 and single magnetoresistive element MTJ which is connected in common to two selection transistors Tr.

Each of selection transistors Tr comprises diffusion layers (source/drain) 21a and 21b in semiconductor layer 11 and word line WL serving as a gate electrode on a channel between diffusion layers 21a and 21b. Word line WL extends in a second direction, and is connected to word line driver 31.

Magnetoresistive element MTJ is disposed above diffusion layer 21a, and connected to diffusion layer 21a. First bit line BL1 is disposed above magnetoresistive element MTJ, and connected to magnetoresistive element MTJ. Also, first bit line BL1 extends in a first direction, and is connected to bit line driver/sinker 32.

Second bit line BL2 is disposed above diffusion layer 21b, and also connected thereto. At time of performing a reading operation, second bit line BL2 also functions as source line SL connected to, e.g., a sense amplifier. Also, second bit line BL2 extends in the first direction, and is connected to bit line driver/sinker & read circuit 33.

The layout of the memory cell array area in the first embodiment is disclosed by way of example, and can be modified as appropriate. For example, in the first embodiment, as viewed from above, i.e., from semiconductor layer 11 toward memory cell array area MA, diffusion layers 21a and 21b, magnetoresistive element MTJ and first bit line BL1 are displaced from each other in the second direction; however, this can be modified as appropriate with respect to, e.g., the displacement amount of those elements and whether or not they are displaced from each other or not.

Also, in the first embodiment, first and second bit lines BL1 and BL2 are provided in different interconnect layers; however, they may be provided in a single interconnect layer.

By virtue of the above structure, according to the first embodiment, cancel magnetic field CMF from magnetic field generation area or areas 16 cancels the stray magnetic field given from reference layer 15 to storage layer 13, thus also canceling a shift (variation) of magnetization reverse current in storage layer 13.

In addition, magnetic field generating area 16 is separated from magnetoresistive elements MTJ arranged in memory cell array area MA. This means that the function of magnetic field generation area 16 to cancel the stray magnetic field does not changed due to process variation between magnetoresistive elements MTJ.

Figure 10:
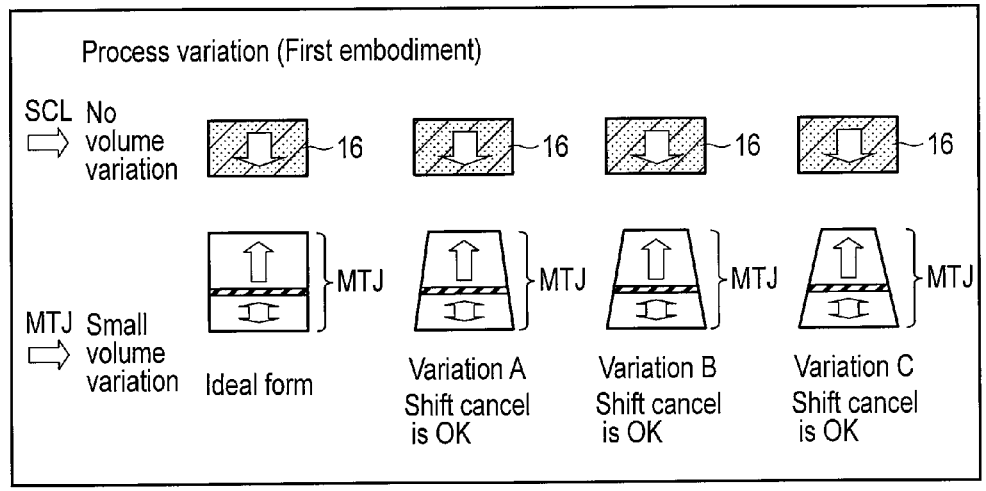
FIG. 10 is a view for use in explaining an advantage of the first embodiment.
Figure 11:
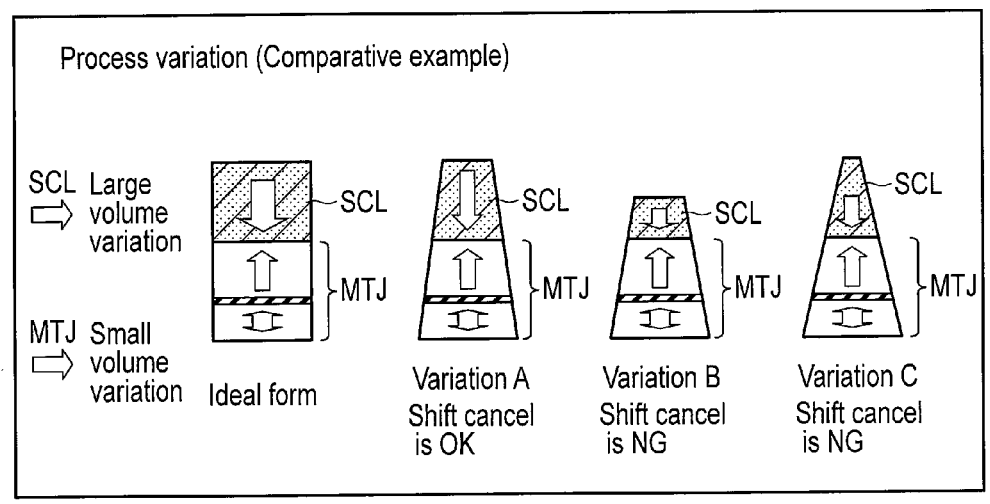
FIG. 11 is a view for showing a comparative example.

For example, as shown in FIGS. 10 and 11, when magnetoresistive elements MTJ are processed, process variation occurs between them; that is, the forms of the magnetoresistive elements MTJ vary as shown as variations A, B and C with respect to an ideal form.

However, as shown in FIG. 10, in the first embodiment, volume variation between the magnetoresistive elements MTJ is small, and magnetic field generating area 16 is not influenced by the process variation between the magnetoresistive elements MTJ, since magnetic field generating area 16 is provided apart from magnetoresistive elements MTJ. This is why as described above, the function of magnetic field generating area 16 to cancel the stray magnetic field does not vary.

Therefore, even if process variation occurs between magnetoresistive elements MTJ, a shift of magnetization reverse current in storage layer 13 can be canceled by magnetic field generating area 16.

On the other hand, in a comparative example shown in FIG. 11, even through volume variation between magnetoresistive elements MTJ is small, that between shift cancelling layers (magnetic layers) SCL for canceling a stray magnetic field is vary great. That is, if the form of magnetoresistive element MTJ differs from the ideal form as shown as variation A, the shift of magnetization reverse current can be canceled; however, if the form of magnetoresistive element MTJ differs from the ideal form as shown as variation B or C, the shift of magnetization reverse current can be canceled.

In such a manner, in the comparative example, since shift cancelling layers SCL are not separated from magnetoresistive elements MTJ, and are provided on magnetoresistive elements MTJ, the process variation between shift cancelling layers SCL is great, and as a result the functions of shift cancelling layers SCL to cancel the stray magnetic field greatly change.

Therefore, in the comparative example, if process variation occurs between magnetoresistive elements MTJ, there is a case where the shift of magnetization reverse current cannot be canceled by shift cancelling layers SCL.

Furthermore, in the first embodiment, cancel magnetic field CMF generated from magnetic field generating area 16 passes through closed magnetic path area 17, and returns to magnetic field generating area 16. That is, closed magnetic path area 17 functions as a closed magnetic path of cancel magnetic field CMF generated from magnetic field generating area 16. This means that firstly, cancel magnetic field CMF generated from magnetic field generating area 16 does not leak from closed path area 17 to the outside thereof, and secondly, closed magnetic path area 17 has a magnetic shield function of preventing an external magnetic field from entering memory cell array area MA.

Therefore, in the first embodiment, cancel magnetic field CMF does not leak from closed magnetic path area 17, it does not adversely affect other magnetic memory devices. Also, since magnetic fields (the stray magnetic field and the external magnetic field) applied to storage layer 13 can be made zero, it is possible to improve the reliability of data retention (residual magnetization), data writing (magnetization reversal), etc., of magnetoresistive elements MTJ.

Second Embodiment

A second embodiment will be explained with reference to FIG. 12.

The second embodiment relates to an example of application of the first embodiment, i.e., an example of application of the magnetic memory device as shown in FIGS. 1 and 2.

The second embodiment has the following structural features, which are not disclosed with respect to the first embodiment: memory chip C comprising semiconductor layer 11, memory cell array area MA and magnetic field generating area 16 is provided; and magnetic field generating area 16 is a magnetic layer which is stacked on memory cell array area MA, and is used in common by magnetoresistive elements MTJ.

With respect to the other structural features, the second embodiment is the same as the first embodiment. Thus, only the points on which the second embodiment differs from the first embodiment will be explained. Therefore, with respect to the second embodiment, structural elements identical to those in the first embodiment will be denoted by the same reference numerals as in the first embodiment, and their detailed explanations will be omitted.

In the second embodiment, magnetic field generating area 16 is disposed in memory chip C. It is therefore preferable that magnetic field generating area 16 be a magnetic layer comprising material suitable for a semiconductor process. Furthermore, the layout of the magnetic layer serving as magnetic field generating area 16 needs to be set to satisfy the following requirements: the magnetic layer is separated from magnetoresistive elements MTJ; it cancels the stray magnetic field applied from reference layer 15 to storage layer 13; and it does not adversely affect the other elements in the memory chip.

Examples of the location of magnetic field generating area 16 will be explained.

Figure 14:
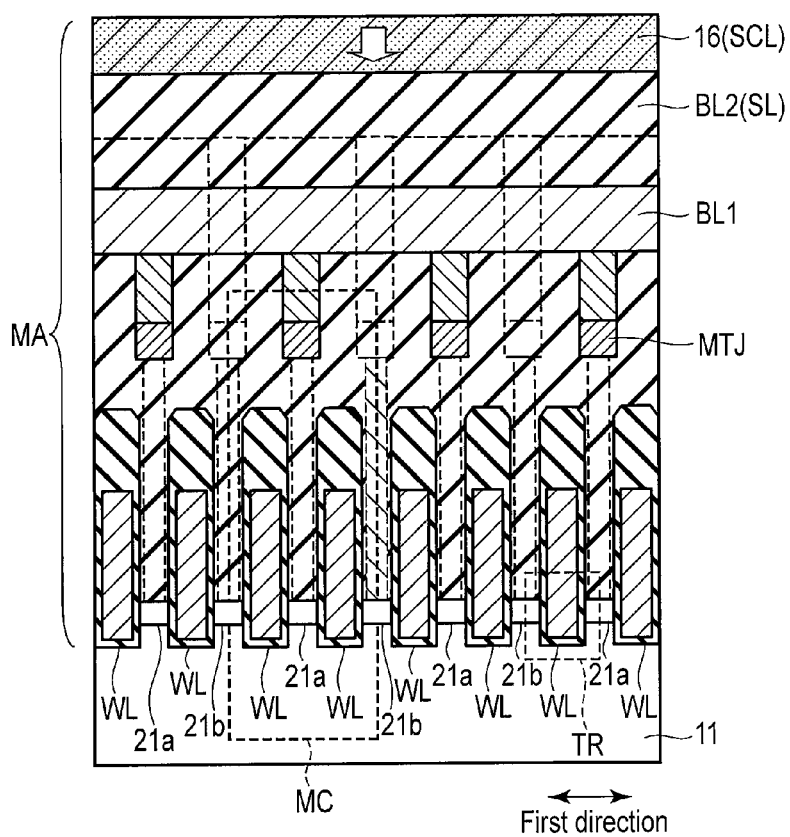
FIG. 14 is a cross-sectional view taken along line XIV-XIV in FIG. 13.
Figure 22:
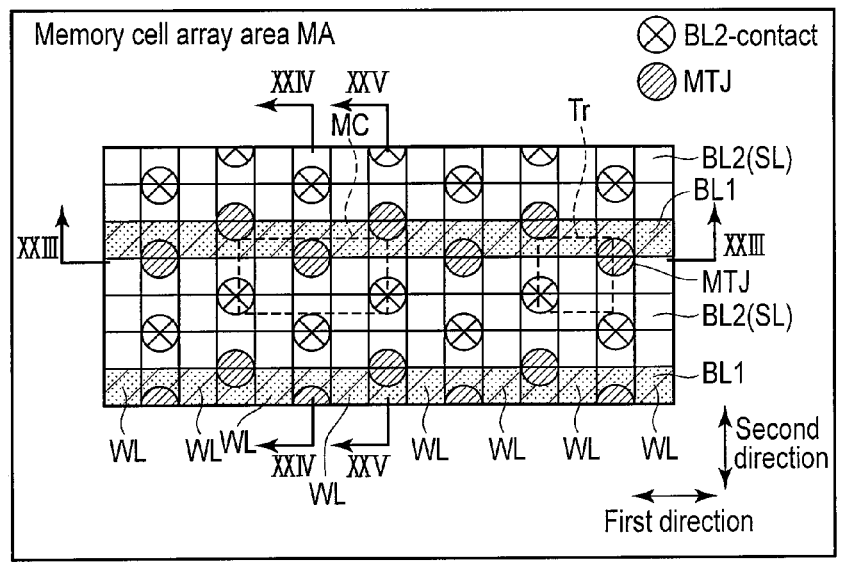
FIG. 22 is a third example of the magnetic memory cell array area as shown in FIG. 12.

FIGS. 13-16 show a first example of the memory cell array. FIG. 14 is a cross-sectional view taken along line XIV-XIV in FIG. 13. FIG. 15 is a cross-sectional view taken along line XV-XV in FIG. 13. FIG. 16 is a cross-sectional view taken along line XVI-XVI in FIG. 13.

With respect to the first example, structural elements identical to those in memory cell array area MA explained with reference to FIGS. 5-8 will be denoted by the same reference numerals as in memory cell array area MS explained with reference to those figures, and their detailed explanation will be omitted.

Magnetic field generating area 16 is provided as shift cancelling layer SCL on memory cell array area MA. Magnetic field generating area 16 may be a permanent magnet or a magnetic layer having invariable magnetization.

For example, magnetic field generating area 16 is formed in the shape of a plate and located on first and second bit lines BL1 and BL2 (SL) in memory cell array area MA, with an insulating layer interposed between magnetic field generating area 16 and first and second bit lines BL1 and BL2. In this case, it is preferable that as shown in FIG. 17, magnetic field generating area 16 should cover memory cell array area MA, but should not cover a peripheral circuit area. This is because above the peripheral circuit area, external terminals (pads) PD are provided as an element for effecting connection to an external element located outside the memory chip C.

FIGS. 18-21 show a second example of the memory cell array area. FIG. 19 is a cross-sectional view taken along line XIX-XIX in FIG. 18. FIG. 20 is a cross-sectional view taken along line XX-XX in FIG. 18. FIG. 21 is a cross-sectional view taken along line XXI-XXI in FIG. 18.

With respect to the second example, structural elements identical to those of memory cell array area MA explained with reference to FIGS. 5-8 will be denoted by the same reference numerals as in memory cell array area MA explained with reference to those figures, and their detailed explanations will be omitted.

Magnetic field generating area 16 is located as shift cancelling layer SCL in memory cell array area MA. Magnetic field generating area 16 may be a permanent magnet or a magnetic layer having invariable magnetization.

For example, magnetic field generating area 16 is stacked on first bit line BL1 in memory cell array area MA. In this case, magnetic field generating area 16 extends in the first direction as first bit line BL1. That is, in the second example, magnetic field generating area 16 functions as part of first bit line BL1.

Figure 23:
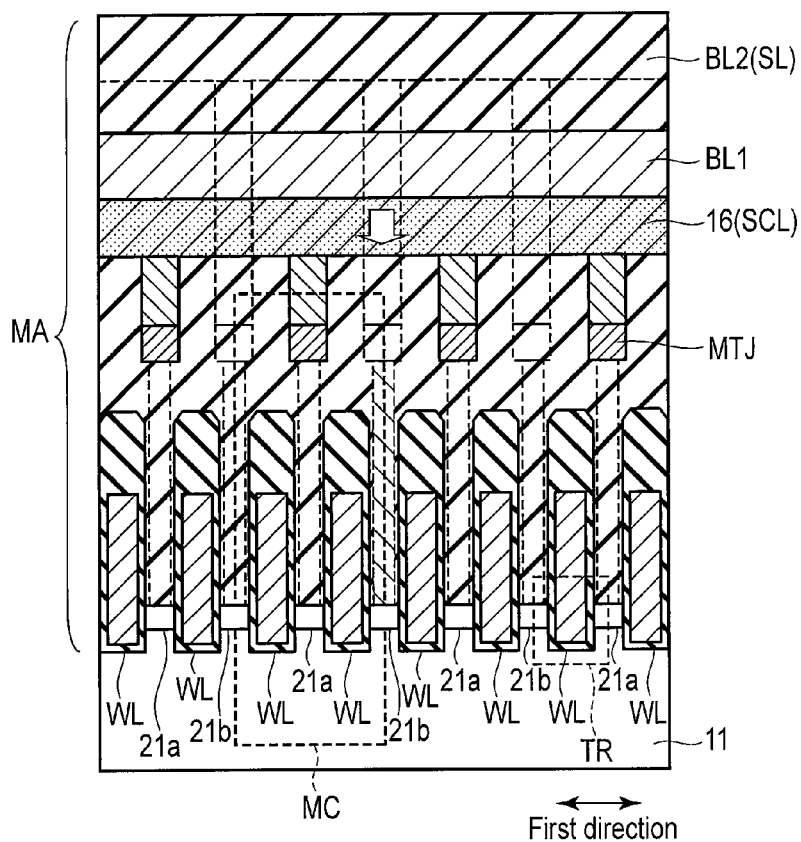
FIG. 23 is a cross-sectional view taken along line XXIII-XXIII in FIG. 22.

FIGS. 22-25 show a third example of the memory cell array area. FIG. 23 is a cross-sectional view taken along line XXIII-XXIII in FIG. 22. FIG. 24 is a cross-sectional view taken along line XXIV-XXIV in FIG. 22. FIG. 25 is a cross-sectional view taken along line XXV-XXV in FIG. 22.

In the third example, structural elements identical to those of memory cell array area MA explained with reference to FIGS. 5-8 will be denoted by the same reference numerals as in memory cell array area MA explained with reference to those figures, and their detailed explanations will be omitted.

Magnetic field generating area 16 is provided as shift cancelling layer SCL in memory cell array area MA. Magnetic field generating area 16 may be a permanent magnet or a magnetic layer having invariable magnetization.

For example, first bit line BL1 in memory cell array area MA is stacked on magnetic field generating area 16. In this case, magnetic field generating area 16 extends in the first direction as first bit line BL1. That is, in the third example, magnetic field generating area 16 functions as part of first bit line BL1.

Figure 12:
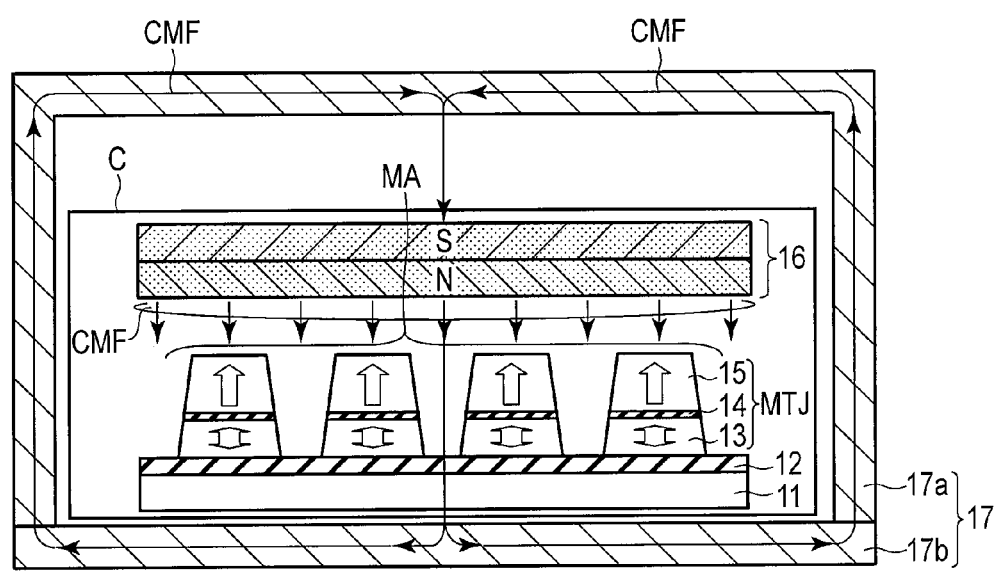
FIG. 12 is a cross-sectional view of a magnetic memory device according to a second embodiment.
Figure 13:
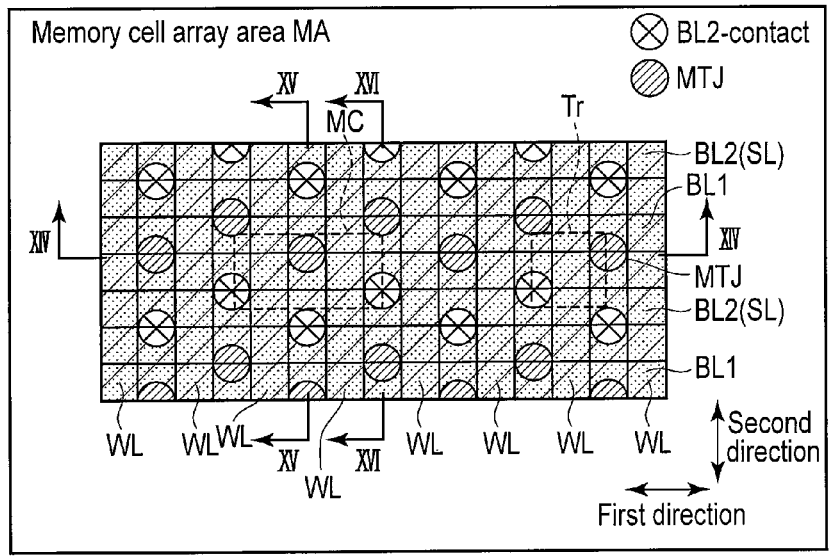
FIG. 13 is a plan view for showing a first example of a memory cell array area as shown in FIG. 12.

It should be noted that referring to FIG. 12, closed magnetic path area 17 includes first part 17a and second part 17b. For example, first part 17b is provided as a mount base for memory chip C, and second part 17a is provided as a lid covering memory chip C.

By virtue of the above structure, the second embodiment can obtain the same advantage as the first embodiment. That is, it is possible to improve the reliability of data retention (residual magnetization), data writing (magnetization reversal), etc., of magnetoresistive elements MTJ.

Third Embodiment

A third embodiment will be explained with reference to FIGS. 26-28.

The third embodiment relates to another example of application of the first embodiment, i.e., another example of application of the magnetic memory device as shown in FIGS. 1 and 2.

The third embodiment has the following structural features, which are not disclosed with respect to the first embodiment: memory chip C comprising semiconductor layer 11 and memory cell array area MA is provided; and magnetic field generating area 16 is provided outside memory chip C, and also used in common by magnetoresistive elements MTJ.

With respect to the other structural features, the third embodiment is the same as the first embodiment. Thus, structural elements identical to those in the first embodiment will be denoted by the same reference numerals as in the first embodiment, and their detailed explanation will be omitted.

In the third embodiment, magnetic field generating area 16 is disposed outside memory chip C. Thus, as the material of magnetic field generating area 16, a most appropriate material can be selected from various materials as appropriate regardless of a semiconductor process. Also, magnetic field generating area 16 can be more flexibly located, as compared with the case where magnetic field generating area 16 is located in memory chip C.

For example, in the example shown in FIG. 26, magnetic field generating area 16 is provided on an upper side of memory chip C. To be more specific, magnetic field generating area 16 may be provided on an upper surface of memory chip C or above the upper surface of memory chip C. Magnetic field generating area 16 includes, e.g., a permanent magnet or a magnetic layer having invariable magnetization.

In the example shown in FIG. 27, magnetic field generating area 16 is provided on a lower side of memory chip C. To be more specific, magnetic field generating area 16 may be provided on a lower surface of memory chip C or below the lower surface of memory chip C. Magnetic field generating area 16 includes, e.g., a permanent magnet or a magnetic layer having invariable magnetization.

In the example shown in FIG. 28, magnetic field generating areas 16 are provided on the upper and lower sides of memory chip C, respectively. That is, memory chip C is sandwiched between magnetic field generating areas 16. In this case also, one of magnetic field generating areas 16 may be provided on or above the upper surface of memory chip C, and the other may be provided on or below the lower surface of memory chip C. Magnetic field generating area 16 includes, e.g., a permanent magnet or a magnetic layer having invariable magnetization.

It should be noted that in the examples of FIGS. 26 to 28, closed magnetic path area 17 includes first part 17a and second part 17b. For example, first part 17b is provided as a mount base for memory chip C, and second part 17a is provided as a lid covering memory chip C.

Also, in the examples of FIGS. 26-28, part of magnetic field generating area 16 may be provided in contact with closed magnetic path area 17. In this case, a closed magnetic path of cancel magnetic field CMF generated from magnetic field generating area 16 is easily formed, and the above shift canceling is easily efficiently performed.

By virtue of the above structure, the third embodiment can obtain the same advantage as the first advantage. That is, it is possible to improve the reliability of data retention (residual magnetization), data writing (magnetization reversal), etc., of magnetoresistive elements MTJ.

Fourth Embodiment

A fourth embodiment will be explained with reference to FIG. 29.

The fourth embodiment relates to an example of application of the first embodiment, i.e., an example of application of the magnetic memory device as shown in FIGS. 1 and 2.

The fourth embodiment has the following structural features, which are not disclosed with respect to the first embodiment: memory chip C including semiconductor layer 11 and memory cell array area MA is provided; circuit board (e.g., multi-layer glass epoxy board) 41 on which memory chip C is mounted is provided; and magnetic field generating area 16 is disposed in circuit board 41, and also used in common by magnetoresistive elements MTJ.

With respect to the other points, the fourth embodiment is the same as the first embodiment. Thus, only points on which the fourth embodiment is different from the first embodiment will be explained, structural elements identical to those in the first embodiment will be denoted by the same reference numerals as in the first embodiment, and their detailed explanation will be omitted.

In the fourth embodiment, magnetic field generating area 16 is located outside memory chip C, and disposed in circuit board 41. Thus, as the material of magnetic field generating area 16, a most appropriate material can be selected from various materials as appropriate regardless of a semiconductor process. Furthermore, magnetic field generating area 16 can be more flexibly located, as compared with the case where magnetic field generating area 16 is provided in memory chip C.

For example, circuit board 41 is provided with a plurality of interconnect layers. A magnetic layer serving as magnetic field generating area 16 is disposed in one of the plurality of interconnect layers. Also, as the magnetic layer serving as magnetic field generating area 16, for example, a magnetic layer having invariable magnetization is applied.

In the fourth embodiment, memory chip C and circuit board 41 are electrically connected to each other by bonding wire 42. However, instead of boding wire 42, they may be electrically connected by flip chip bonding, a Through Silicon Via (TSV), or the like.

Furthermore, in the fourth embodiment, memory chip C is covered by resin 43; however, resin 43 may be omitted or located close to memory chip C.

FIGS. 30-34 show an example of a manufacturing method of the magnetic memory device as shown in FIG. 29.

As shown in FIG. 30, circuit board 41 is provided with a magnetic layer serving as magnetic field generating area 16 (see FIG. 29). Circuit board 41 includes chip mount areas 51 on its top surface and electrodes 44 on its bottom surface. First, memory chips C comprising magnetoresistive elements are mounted on chip mount areas 51, respectively.

Next, as shown in FIG. 31, memory chip C and circuit board 41 are electrically connected to each other by bonding wire 42. Then, memory chip C is covered by resin 43.

Thereafter, as shown in FIGS. 32 and 33, a magnetic layer is formed as closed magnetic path area 17 covering surfaces of circuit board 41 and resin 43. Closed magnetic path area 17 includes opening portion OP from which electrode 44 are exposed as shown in FIG. 32.

By virtue of the above steps, a magnetic memory device as shown in FIG. 29 is completely manufactured.

However, as shown in FIG. 34, which is a plan view, it is preferable that memory chip C be completely surrounded by closed magnetic path area 17. That is, it is preferable that memory chip be located at a center portion of circuit board 41, and electrodes 44 or opening portions OP of closed magnetic path area 17 be located at edge portions of circuit board 41.

By virtue of the above structure, the fourth embodiment can obtain the same advantage as the first embodiment. That is, it is possible to improve the reliability of data retention (residual magnetization), data writing (magnetization reversal), etc., of magnetoresistive elements MTJ.

(Modification)

The above embodiments can be modified as follows:

Magnetic field generating area 16 may include material for assembling a memory chip, which is, e.g., a magnetic material included in an adhesive material such as a bonding paste, a die attach film or an adhesive film. That is, the adhesive material can be applied as magnetic field generating area 16 by mixing the magnetic material into the adhesive material.

Furthermore, a memory chip (MRAM chip) comprising magnetoresistive elements MTJ and another chip such as a NAND chip or a controller chip may be provided in closed magnetic path area 17. In this case, it is possible to provide a storage device in which the above MRAM chip is used as a cache memory.

It should be noted that such a storage device is applied to a portable device or the like, and is easily influenced by, especially, an external magnetic field and an electromagnetic wave. Therefore, it is advantageous to apply the above embodiments to the storage device.

CONCLUSION

As explained above, according to the above embodiments, it is possible to reliably cancel the stray magnetic field from the reference layer to the storage layer, regardless of the process variation between magnetoresistive elements, and also shield magnetoresistive elements from the external magnetic field. It is therefore possible to improve the reliability of data retention (residual magnetization), data writing (magnetization reversal), etc., of magnetoresistive elements MTJ.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a semiconductor substrate;
   a memory cell array area on the semiconductor substrate, the memory cell array area including magnetoresistive elements, each of the magnetoresistive elements having a reference layer with an invariable magnetization, a storage layer with a variable magnetization, and a tunnel barrier layer therebetween;
   a magnetic field generating area which generates a first magnetic field cancelling a second magnetic field applying from the reference layer to the storage layer, and which is separated from the magnetoresistive elements; and
   a closed magnetic path area functioning as a closed magnetic path of the first magnetic field, and surrounding the memory cell array area and the magnetic field generating area.

2. The device of claim 1, wherein the closed magnetic path area functions as a package of the memory cell array area and the magnetic field generating area.

3. The device of claim 1, wherein the magnetic field generating area includes a permanent magnet.

4. The device of claim 1, wherein the magnetic field generating area includes a magnetic layer with an invariable magnetization.

5. The device of claim 1, wherein
   the reference layer and the storage layer has a perpendicular magnetization which is perpendicular to a surface of the semiconductor substrate, and
   the first magnetic field has magnetic lines which are perpendicular to the surface of the semiconductor substrate in the memory cell array area.

6. The device of claim 1, wherein
   the reference layer and the storage layer has a in-plane magnetization which is parallel to a surface of the semiconductor substrate, and
   the first magnetic field has magnetic lines which are parallel to the surface of the semiconductor substrate in the memory cell array area.

7. The device of claim 1, further comprising:
   a memory chip including the semiconductor substrate, the memory cell array area, and the magnetic field generating area.

8. The device of claim 7, wherein the magnetic field generating area is a magnetic layer stacked on the memory cell array area and shared by the magnetoresistive elements.

9. The device of claim 8, wherein
   the memory chip includes a peripheral circuit area, and the magnetic layer is provided in the memory cell array area and not provided in the peripheral circuit area.

10. The device of claim 9, wherein the peripheral circuit area includes an external terminal connected to an external element which is provided out of the memory chip.

11. The device of claim 8, further comprising:
a bit line connected to the magnetoresistive elements, the magnetic layer stacked on the bit line and extending in a direction in which the bit line extends.

12. The device of claim 8, further comprising:
a bit line connected to the magnetoresistive elements, the bit line stacked on the magnetic layer extending in a direction in which the bit line extends.

13. The device of claim 1, further comprising:
a memory chip including the semiconductor substrate and the memory cell array area,
wherein the magnetic field generating area is provided out of the memory chip.

14. The device of claim 13, wherein the magnetic field generating area is a magnetic layer provided on the memory chip and shared by the magnetoresistive elements.

15. The device of claim 14, wherein the magnetic layer includes a permanent magnet.

16. The device of claim 13, wherein the magnetic field generating area is a magnetic layer provided under the memory chip and shared by the magnetoresistive elements.

17. The device of claim 16, wherein the magnetic layer includes a permanent magnet.

18. The device of claim 1, further comprising:
a memory chip including the semiconductor substrate and the memory cell array area; and
a circuit board on which the memory chip is mounted,
wherein the magnetic field generating area is provided in the circuit board.

19. The device of claim 18, wherein
the circuit board comprises wiring layers, and
the magnetic field generating area is a magnetic layer provided in one of the wiring layers and shared by the magnetoresistive elements.

20. The device of claim 19, wherein the magnetic layer has an invariable magnetization.

* * * * *